(12) United States Patent
Usuda et al.

(10) Patent No.: US 6,690,043 B1
(45) Date of Patent: Feb. 10, 2004

(54) SEMICONDUCTOR DEVICE AND METHOD OF MANUFACTURING THE SAME

(75) Inventors: Koji Usuda, Yokohama (JP); Shinichi Takagi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 80 days.

(21) Appl. No.: 09/717,039

(22) Filed: Nov. 22, 2000

(30) Foreign Application Priority Data

Nov. 26, 1999 (JP) ............................................. 11-336059

(51) Int. Cl.[7] ........................................... H01L 31/0328
(52) U.S. Cl. ........................................ 257/194; 257/192
(58) Field of Search ................................. 257/192, 194

(56) References Cited

U.S. PATENT DOCUMENTS

| | | | |
|---|---|---|---|
| 5,216,271 A | | 6/1993 | Takagi et al. |
| 5,218,213 A | * | 6/1993 | Gaul et al. ..................... 257/55 |
| 5,759,898 A | * | 6/1998 | Ek et al. ..................... 438/291 |
| 5,847,419 A | * | 12/1998 | Imai et al. ................... 157/192 |

FOREIGN PATENT DOCUMENTS

| | | |
|---|---|---|
| JP | 7-169926 | 7/1995 |
| JP | 9-321307 | 12/1997 |
| JP | 11-121377 | 4/1999 |

OTHER PUBLICATIONS

J. Welser, et al., "Strain Dependence of the Performance Enhancement in Strained–Si n–Mosfets," IEDM, 1994, pp. 373–376.

* cited by examiner

*Primary Examiner*—Douglas A. Wille
(74) *Attorney, Agent, or Firm*—Oblon, Spivak, McClelland, Maier & Neustadt, P.C.

(57) ABSTRACT

A semiconductor device comprises a base substrate, an insulating film formed on the substrate, an undoped first and lattice-relaxed semiconductor layer formed on the insulating film, a second semiconductor layer having a tensile strain and formed on the first semiconductor layer, and a MISFET formed on the second semiconductor layer. Since the MISFET is formed in a strained Si layer, electrons are prevented from scattering in a channel region, improving the electron mobility. Furthermore, since the MISFET is formed in a thin SOI layer having a thickness of 100 nm or less, it is possible to reduce a parasitic capacitance in addition to the improvement of the electron mobility. As a result, the MISFET excellent in drivability can be obtained.

3 Claims, 4 Drawing Sheets

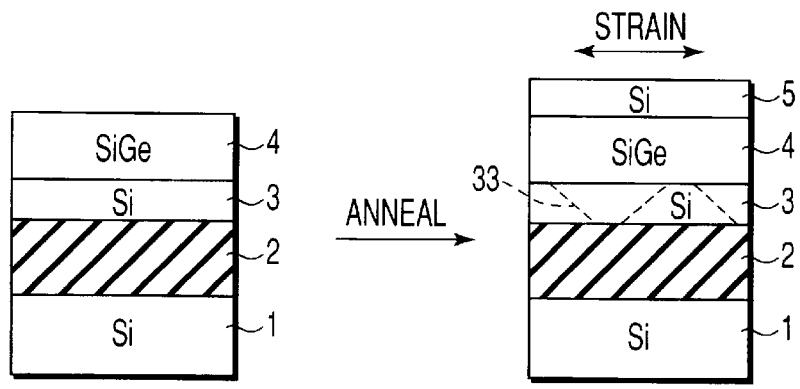
FIG. 1A PRIOR ART
FIG. 1B PRIOR ART
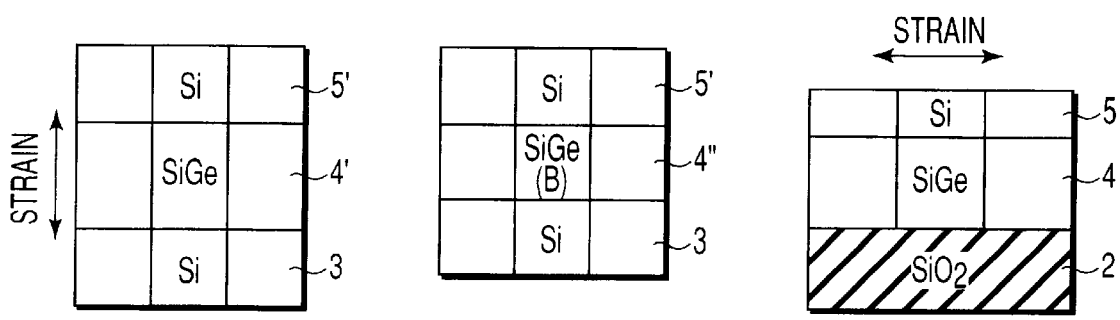
FIG. 2A PRIOR ART
FIG. 2B PRIOR ART
FIG. 2C

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 11-336059, filed Nov. 26, 1999, the entire contents of which are incorporated herein by reference.

BACKGROUND OF THE INVENTION

The present invention relates to a semiconductor device and a method of manufacturing the same, and more particularly, a semiconductor device employing a strained-Si layer as an active region and a method of manufacturing the same.

The performance of Si semiconductor elements, in particular, MOSFETs, has increased year after year with the advance of large-scale integrated circuits (LSI). However, it has been recently pointed out that the miniaturization attained by a lithographic technology has reached its limit, and that a carrier mobility has almost reached theoretical mobility in Si. Under the circumstances, it is difficult to further improve the performance of MOSFETs.

To attain higher performance of the semiconductor device, attempts have been made to use a crystal such as a GaAs semiconductor crystal or an SiC semiconductor crystal in place of an Si crystal since they have a faster theoretical mobility than the Si crystal.

However, it is difficult to introduce the manufacturing process for the GaAs semiconductor crystal or the SiC crystal into the manufacturing process of the Si device presently used. Therefore, a lot of time and labor are required for developing this kind of device. As a matter of fact, when this kind of device is manufactured on a large scale, the whole manufacturing line must be redesigned from the beginning or some of the manufacturing apparatus must be replaced.

Therefore, it is now strongly desired that a high-performance Si-based semiconductor device is developed in a short development period and at a low cost by using know-how of the presently-used manufacturing process and manufacturing apparatus for the Si device.

To attain such a device, studies have been made to improve the performance of Si-MOSFET by increasing the electron mobility in Si. As one of the methods for increasing the electron mobility in Si, a technique for applying a strain to a Si layer has drawn attention. Generally, when the strain is applied to a semiconductor layer, the band structure is changed to suppress the scattering of carriers in a channel. Therefore, the electron mobility is expected to improve.

To explain more specifically, when a compound crystal layer including a material having a lattice constant larger than that of Si is formed on a Si substrate, for example, a SiGe compound crystal containing 20 atomic % of Ge (hereinafter, simply referred to as "SiGe layer") is formed as thick as several $\mu$m so as to obtain lattice relaxation, and then, a Si layer as thin as several nm is formed on the lattice-relaxed SiGe layer thus obtained, strain, which is generated due to the difference in lattice constant between SiGe and Si, is applied to the Si layer. As a result, a strained Si layer is obtained.

It has been reported that if the strained Si layer thus obtained is employed as a channel of a MOSFET, the electron mobility can be greatly improved to about 1.76 times larger than that of the non-strained Si layer (J. Welser, J. L. Hoyl, S. Tagkagi and J. F. Gibbons, IEDM 94-373).

Furthermore, another method is known for improving the electron mobility in Si by reducing the channel length of the MOSFET. However, when the channel length is reduced, the effect of stray capacitance increases, with the result that it is difficult to improve the electron mobility as desired.

To overcome this problem, attention is drawn to a structure having a channel layer formed within an SOI layer (Silicon On Insulator: an Si layer is formed on an Si substrate with an insulating film interposed between them). Since the channel layer is completely isolated by the insulating film in this structure, it becomes easier to decrease the stray capacitance and isolate the element. Furthermore, reduction of power consumption and higher integration can be expected.

Under the circumstances, attempts have been made to form a structure of a semiconductor device by employing the strained Si layer (for improving the electron mobility) in the SOI structure (responsible for lowering the stray capacitance and attaining element isolation).

The structure of such a semiconductor device will be explained with reference to FIGS. 1A and 1B.

As shown in FIG. 1A, an SOI substrate having an $SiO_2$ insulating film 2 and SOI layer 3 having a thickness between 20 nm and 30 nm previously formed on an Si substrate 1 is prepared. Thereafter, an SiGe layer 4 containing 20 atomic % of Ge and having a larger lattice constant than Si is formed on the SOI substrate. The SiGe layer herein is formed sufficiently thicker than the SOI layer 3.

Then, as shown in FIG. 1B, annealing is performed for one hour at 1100° C. in a nitrogen containing atmosphere. At this time, since tensile strain is applied from the SiGe layer 4 to the SOI layer 3, the SOI layer 3 is plastically deformed and thus lattice-relaxed. At the same time, the SOI layer 4 is also lattice-relaxed. By the plastic deformation, a dislocation 33 such as a threading dislocation and a misfit dislocation, is produced in the SOI layer 3.

Subsequently, a thin Si film is formed on the lattice-relaxed SiGe layer 4. Due to the presence of the thin Si film, it is possible to form a strained Si layer 5 having a tensile strain.

Since the dislocation is produced and confined within the lattice-relaxed SOI layer 3, it has been considered that the most of dislocation 33 is not propagated to the lattice-relaxed SiGe layer 4. However, it was found that if annealing for lattice relaxation is performed in a nitrogen-containing atmosphere for one hour at a temperature of 1100° C., the dislocation 33 can be propagated to the surface of SiGe layer 4 with a density of about one/10 $\mu m^2$. Due to defects such as a dislocation, the crystallinity of the strained Si layer 5 deteriorates. Thereafter, a semiconductor device such as a MOSFET is formed on the strained Si layer 5. However, the deterioration in crystallinity of the strained Si layer 5 may degrade characteristics of the resultant semiconductor device. The deterioration more significantly appears with the miniaturization of the semiconductor device.

The defects produced by lattice-relaxation of the SiGe layer 4 may be sometimes amplified in a high-temperature processing step when a gate and an electrode are formed and when annealing is performed for recovering the crystallinity after ion doping. In this case, the crystallinity of the strained Si layer 5 may be further degraded.

To prevent the dislocation 33, which is produced in the SOI layer for lattice-relaxation, from propagating to the surface of the SiGe layer, the SiGe layer 4 must be formed with a thickness of several μm or more. However, to produce a sufficient effect of suppressing the stray capacitance due to the SOI substrate structure, it is necessary to suppress a total thickness from the $SiO_2$ insulating layer 2 to the strained Si layer 5 (serving as a channel layer) as much as possible. However, since, in this method, the SiGe layer 4 must be formed with several μm, it is impossible to sufficiently produce the effect brought about by the SOI substrate structure.

As described above, there are problems in a conventional semiconductor device having a strained Si layer (as a channel layer) formed on the SOI substrate. That is, to prevent the defects, the semiconductor film has to be formed thick on the SOI substrate insulating film. If the thickness of the semiconductor layer formed on the SOI substrate insulting film is reduced, the defects become clearly apparent.

BRIEF SUMMARY OF THE INVENTION

An object of the present invention is to provide a high-performance semiconductor device and a method of the manufacturing the high-performance semiconductor device capable of not only reducing the thickness of a film formed on an insulating layer of an SOI substrate but also decreasing defects of a strained layer serving as a channel layer, and capable of applying sufficient strain to the channel layer.

To attain the aforementioned object, a semiconductor device according to a first aspect of the present invention comprises:

a substrate;

an insulating film formed on the substrate;

a first semiconductor layer lattice-relaxed and formed on the insulating film substantially in contact therewith;

a second semiconductor layer having a tensile lattice strain and formed on the first semiconductor layer, a lattice constant of the second semiconductor layer being smaller than that of the first semiconductor layer;

a gate insulting layer selectively formed on the second semiconductor layer;

a gate electrode formed on the gate insulating film;

a channel region formed in a surface of the second semiconductor layer immediately under the gate electrode; and a pair of source/drain regions selectively formed in the second semiconductor layer so as to be spaced apart from each other by the channel region.

According to a second aspect of the present invention, there is provided a method of manufacturing a semiconductor device comprising:

a first step of forming an insulating film on a substrate;

a second step of forming a stacked substrate having a stacked layer of a first semiconductor layer and a second semiconductor layer formed on the first semiconductor layer;

a third step of bonding the substrate and the stacked substrate such that the insulating film faces the first semiconductor layer;

a fourth step of removing the stacked substrate so as to allow the first semiconductor layer and at least part of the second semiconductor layer to remain, thereby forming a stacked structure formed of the first semiconductor layer lattice-relaxed and the second semiconductor layer having a strain applied on a surface thereof; and a fifth step of forming a transistor on the semiconductor layer having the strain applied on the surface thereof.

According to a third aspect of the present invention, there is provided a method of manufacturing a semiconductor device comprising:

a first step of forming an insulating film on a surface of a substrate;

a second step of forming a first semiconductor layer on a surface of a semiconductor substrate;

a third step of bonding the substrate and the semiconductor substrate such that the insulating film faces the first semiconductor layer;

a fourth step of removing the semiconductor substrate so as to allow at least the first semiconductor layer to remain, thereby lattice-relaxing the first semiconductor layer;

a fifth step of stacking a second semiconductor layer on the first semiconductor layer, thereby applying a tensile strain to the second semiconductor layer;

a sixth step of forming a transistor on the second semiconductor layer;

In the present invention, the following constitutions are preferable.

(1) The thickness of the first semiconductor layer is 80 nm or less.

(2) The total thickness of the first semiconductor layer and the second semiconductor layer is 100 nm or less.

(3) The lattice distance of the first semiconductor layer is nonuniform in a thickness direction.

(4) The first semiconductor layer is an SiGe layer, the Ge content of at least the surface of the first semiconductor layer in contact with the second semiconductor layer is larger than 30 atomic %, and a second semiconductor layer is Si.

(5) The first semiconductor layer is an SiGe layer, having a gradient content such that the Ge content of the first semiconductor layer at a portion thereof adjacent to the base substrate is 30 atomic % or less and the Ge content of the first semiconductor layer at a portion thereof adjacent to the second semiconductor layer is larger than 30 atomic %, and the second semiconductor layer is Si.

(6) The first semiconductor layer and the second semiconductor layer are different in lattice constant and a combination selected from the group consisting of Si, SiGe, GaAs, SiC, GaN, GaAlAs, InGaP, InGaPAs, $Al_2O_3$ BN, BNC, C, doped Si, SiNx and ZnSe, to produce a tensile strain in the second semiconductor layer. More specifically, the second semiconductor layer or the semiconductor substrate is Si, B, As, P, C, Ge, Ga, In, Al, Zn, Se or a compound crystal thereof. Furthermore, the second substrate is any one of Si, GaAs, ZnSe, SiC, Ge, SiGe, sapphire, organic glass, inorganic glass, and plastic.

Note that a covalent radius of Si and Ge is 1.17 and 1.22, respectively. When an SiGe layer and an Si layer are stacked on an Si substrate in this order by a general epitaxial growth technique, the lattice of an SiGe layer 4' matches with the lattices of upper and lower Si layers 3, 5' and deforms longitudinally, as shown in FIG. 2A and a tensile strain is generated in the SiGe layer 4' in a longitudinal direction of the figure. To an Si layer formed on such an SiGe layer 4", a sufficient tensile strain is not applied.

On the other hand, there is known another technique (e.g., Japanese Patent Application KOKAI No. 11-121377) characterized by doping B (boron) into the SiGe etching stopper layer in an amount of $10^{20}$–$10^{21}$ atoms/cm$^3$ by making use of its covalent-bonding radius of 0.88. The technique teaches omission of CMP (chemical Mechanical Polishing) to be performed after cleaving in a hydrogen delamination method performed at the time the SOI substrate is formed. FIG. 2B schematically shows how to perform lattice matching in this technique. Reference numerals 3 and 5' denote Si. Reference numeral 4" denotes B-doped SiGe. The B-doped SiGe layer 4" is used as an etching stopper, which is removed later. In the aforementioned publication, an SiGe layer can be formed in place of the uppermost Si layer 5' and later used as a device layer. However, since the SiGe layer contains B which is heat-diffused from the SiGe (B) layer 4" in a manufacturing process, it inevitably has a residual compression strain. It is possible to further form an Si layer (serving as a device layer) on the SiGe device layer. However, sufficient strain is not applied to the Si layer.

The stained Si layer serving as the device layer is attained by forming a three-layered structure of Si/SiGe/Si as shown in FIGS. 1A and 1B. However, a dislocation 33 is propagated to a Si layer 5, as aforementioned. In the present invention, as shown in FIG. 2C, a lattice-relaxed SiGe layer 4 is formed on a silicon oxide film 2 substantially in contact therewith, and thereafter, the Si layer 5 is formed on the lattice-relaxed SiGe layer 4 by a bonding method etc. At this time, a sufficient tensile strain is generated in the Si layer 5 in the lateral direction in the figure by the lattice-relaxed SiGe layer. Furthermore, the crystallinity of the strained Si layer 5 is not degraded, because the SOI layer 3 having the dislocations 33 is not provided thereunder. In the present invention, a high-temperature annealing step is not employed to lattice-relax the SiGe layer unlike a conventional technique. Therefore, the present invention is free from such a phenomenon that a threading dislocation due to high temperature annealing is introduced in an underlying silicon layer and reaches the strained Si device layer forming a channel to deteriorate device characteristics. Hence, in the present invention, the thickness of the SiGe layer can be reduced than that formed by using the conventional technique, so that the total thickness of the SiGe layer and Si layer on the insulating layer can be reduced to about ⅔ (100 nm or less) of that of conventional one. Accordingly, a sufficient strain can be applied to the semiconductor device layer without losing advantages of the SOI structure, that is, without the effect from the stray capacitance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B are cross-sectional views for explaining a method of manufacturing a conventional strained Si substrate;

FIGS. 2A and 2B are schematic cross-sectional view of a substrate for explaining how to generate strain in a conventional Si/SiGe/Si laminate substrate;

FIG. 2C is a cross-sectional view of a substrate for explaining how to generate strain of an SiO$_2$/SiGe/Si laminate substrate according to the present invention;

DETAILED DESCRIPTION OF THE INVENTION

Now, embodiments of the present invention will be explained with reference to the accompanying drawings.

First embodiment

Figure 3A:
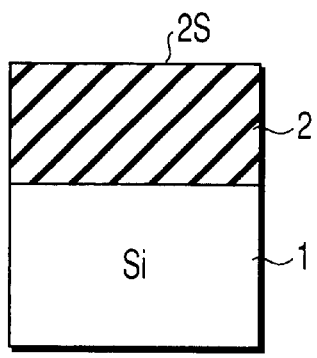
FIGS. 3A–3C are cross-sectional views of a substrate for explaining a method of manufacturing a semiconductor substrate according to a first embodiment of the present invention.
Figure 3B:
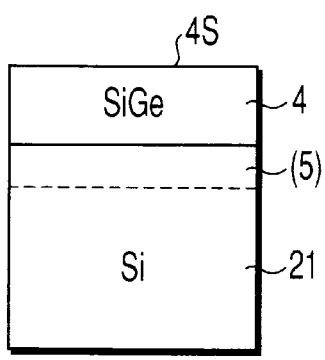
Figure 3C:
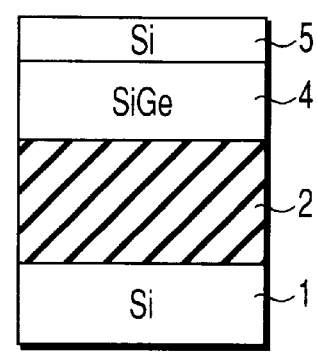

FIGS. 3A–3C are cross-sectional views of a semiconductor substrate for explaining a method of manufacturing a semiconductor substrate according to a first embodiment of the present invention.

In the first place, as shown in FIG. 3A, an Si oxide film 2 is formed on an Si substrate (base substrate) 1. The Si oxide film 2 is formed by any method widely employed, e.g., a thermal oxide film such as a dry oxide film or a wet oxide film, a CVD (Chemical Vapor Deposition) oxide film, or a wet oxide film formed by treating with a solution.

Subsequently, as shown in FIG. 3B, an SiGe thin film 4 is formed on another Si substrate 21. To improve the performance, the Ge content of the SiGe thin film 4 near the Si substrate 21 is set at a value larger than 30 atomic % and the SiGe thin film 4 is basically undoped with impurities. If the Ge content is larger than 30 atomic %, the mobility of electrons in the strained Si layer can be increased to the maximum. The Ge content is preferably less than 80 atomic %.

The SiGe thin film 4 can be formed by a CVD, MBE (molecular Beam Epitaxy) or sputtering process. When the SiGe thin film 4 is formed by the CVD process, an Si source gas and a Ge source gas are introduced onto the Si substrate 21 heated at 550° C. to grow an SiGe layer.

Then, the substrate 1 and the substrate 21 are bonded to each other in such a manner that the upper surface 2s of the Si oxide film 2 is allowed to face the upper surface 4s of the SiGe thin film 4. In one of bonding methods, the substrates are pre-annealed at a temperature of several hundreds (e.g., about 400–700° C.) before bonding and annealed at a high-temperature (in a nitrogen atmosphere, 1100° C., one hour) after bonding to enhance the bonding strength. In this step, a thin film SiGe layer 4 is not lattice-relaxed, so that a dislocation is not generated.

Subsequently, as shown in FIG. 3C, the Si substrate 21 is removed by polishing. At this time, a compressive strain applied from the Si substrate 21 is released to lattice-relax the SiGe layer 4.

In this step, if the Si layer 5 is allowed to remain extremely thin on the surface of the Si substrate 21, the SiGe layer 4 is lattice-relaxed; at the same time, a tensile strain is introduced in the Si layer 5. If so, a good strained Si layer 5 can be formed without a dislocation, pit and protrusion.

In this manner, a semiconductor substrate is formed as a lamination of the Si substrate 1, the Si oxide film 2 formed on the Si substrate 1, the SiGe layer 4 formed on the lattice-relaxed Si oxide film 2 by bonding, and the strained Si layer 5 formed on the lattice-relaxed SiGe layer 4.

Although the $SiO_2$ layer 2 is substantially in contact with the lattice-relaxed SiGe layer 4, there may be provided an interface buffer layer having a thickness ranging from 0 to 5 nm, preferably ranging from 0 to 2 nm, between the $SiO_2$ layer 2 and the lattice-relaxed SiGe layer 4. The interface buffer layer is formed of, e.g., Si.

The strained Si layer 5 can be formed by another method which includes first applying the polishing or delamination up to a top of the SiGe layer 4, thereby lattice-relaxing the SiGe layer 4 and then regrowing an extremely thin silicon layer 5 by an MBE or CVD method.

As described, to lattice-relax the SiGe thin film 4 by removing the Si substrate 21 on which the SiGe thin film 4 has been previously formed, it is preferable that the film thickness of the SiGe thin film 4 be more than 10 nm and less than 80 nm. Furthermore, if the film thickness of the strained Si layer 5 formed on the SiGe thin film 4 is about 5 to 50 nm, and the total film thickness of SiGe thin film 4 and the Si layer 5 is between 15 nm and 100 nm, a good strained semiconductor film can be formed without defects, thereby preventing a short channel effect.

The removal or thinning of the Si substrate 21 may be generally performed by chemical polishing or chemical mechanical polishing using a chemical agent and a polishing agent, or by PACE (Plasma Assisted Chemical Dry Etching) which is capable of improving uniformity of thickness after reducing the thickness. Alternatively, hydrogen is doped into a predetermined sheet-like region of the SiGe layer 4 or the Si substrate 21 in advance and then the delamination is performed from the hydrogen-doped region (called a hydrogen delamination method) or the Si substrate 21 is oxidized and removed with an HF solution (called a film-reducing method).

In this invention, in the case where an SiGe layer 4 as thin as 40 nm is formed on the Si substrate 21 before the bonding step, the SiGe layer 4 is the layer to which a compression strain has been applied. The strain of the SiGe layer 4 can be released by reducing thickness of the Si substrate 21 or removing the Si substrate 21 after the bonding. In this way, the strain applied on the SiGe layer 4 from the Si substrate 4 can be reduced. As a result, the SiGe layer 4 functions as a stressor (an object of the present invention) for applying strain upon an Si device layer.

The site at which hydrogen is injected when the Si substrate 21 is removed, varies depending upon the specification of the process, such as the thickness and crystallinity of the Si substrate 21. At this time, if the liquid-etching is performed or the hydrogen delamination is performed, the surface sometimes becomes coarse after the removal. Particularly in the PACE method, sometimes defects due to the process are introduced from the surface.

In these cases, if annealing is performed, after the thinning step, in an atmosphere of hydrogen, argon, nitrogen, or oxygen in order to recover the crystal surface or the inner crystal of the Si substrate 21, a homogeneous and high-quality thin-film formation process can be attained.

As the Si substrate 1 and the Si substrate 21, CZ, FZ or MCZ substrate can be used. Particularly, in the case where, the surface of the Si substrate 21 is used as an Si device layer as it is after the thinning or delamination step, an FZ substrate is effectively used to obtain good crystallinity since precipitated oxygen is low.

In addition, if the concentration of impurities contained in the Si substrate 21 or a type of impurities is properly selected, it is possible to previously control the surface of the Si substrate 21 so as to have a desired resistance value.

In the SOI structure having a strained Si device layer 5 having a desired thickness thus formed, the total thickness of the layers on the Si oxide insulating layer 2 can be reduced to about ⅔. Furthermore, the density of the dislocation present on the surface of the SiGe layer 4 can be reduced by 10% or more. As a result, a high-quality strained Si device layer 5 is formed.

Figure 12:
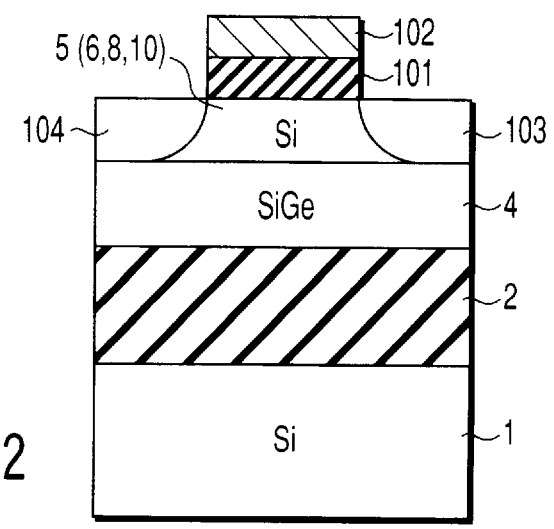
FIG. 12 is a cross-sectional view of a semiconductor device of the present invention having a semiconductor substrate of the present invention applied to a MOSFET.

FIG. 12 is a cross-sectional view of a MISFET (MOSFET) formed on the strained silicon layer 5. The MISFET is formed as follows.

In the first place, the surface of the strained silicon layer 5 is thermally oxidized to form a thin gate oxide film 101 of about 10 nm-thick. Then, for example, n-type impurity ions for adjusting a threshold voltage are doped into a channel region through the gate oxide film 101, to form an n-type channel region.

Then, a polysilicon film serving as a gate electrode 102 is formed on the gate oxide film 101 by a reduced-pressure CVD method. Thereafter, the polysilicon film is patterned by RIE (Reactive Ion Etching) to form a gate electrode 102.

Subsequently, using the gate electrode 102 as a mask, n-type impurity ions such as phosphorus ions are selectively doped. Thereafter, annealing is performed at a temperature of about 800° C. As a result, an n-type source region 103 and an n-type drain region 104 are formed in a self-alignment manner with the gate electrode 102. In this way, an n-type channel MISFET is formed. If p-type impurity ions are used in place of the n-type impurity ions, a p-channel MISFET can be formed in the same manner.

Since the MISFET as mentioned above is formed in the strained Si layer, electrons are prevented from scattering in the channel region, improving their mobility. Furthermore, the MISFET is formed in a thin SOI layer having a thickness of 100 nm or less. It is therefore possible to reduce parasitic capacity in addition to the improvement of the electron mobility. As a result, the MISFET excellent in drivability can be obtained.

Second Embodiment

Figure 4A:
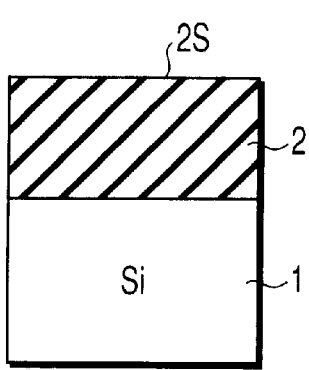
FIGS. 4A–4C are cross-sectional views of a substrate for explaining a method of manufacturing a semiconductor substrate according to a second embodiment of the present invention.
Figure 4B:
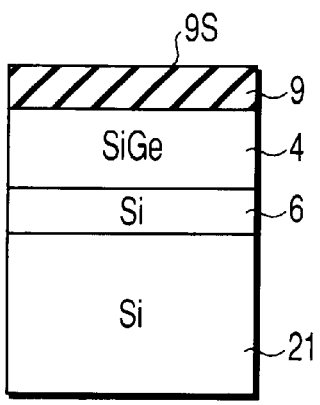
Figure 4C:
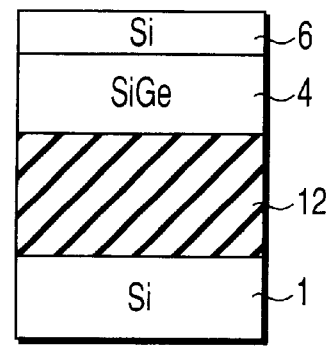

FIGS. 4A–4C are cross-sectional views showing a method of manufacturing a semiconductor substrate according to a second embodiment of the present invention. In this embodiment, after an epitaxial Si layer 6 is formed on the Si substrate 21, an SiGe layer 4 is stacked, and further an Si oxide film 9 is formed on the SiGe layer 4. This is used as one of the two substrates to be bonded.

In the first place, as shown in FIG. 4A, an Si oxide film 2 is formed on an Si substrate 1 in the same manner as in the first embodiment. Subsequently, as shown in FIG. 4B, an epitaxial Si layer 6 serving as an element formation layer (device layer) is formed on a CZ Si substrate 21. Then, an SiGe thin film 4 is formed on the epitaxial Si layer 6 in the same manner as in the first embodiment. The Ge content of the SiGe layer 4 near the epitaxial Si layer 6 is larger than 30 atomic %. Thereafter, an Si oxide film 9 is formed on the SiGe thin film 4.

Subsequently, two Si substrates 1 and 21 are bonded in such a manner that the upper surface 2s of the Si oxide film 2 is allowed to face the upper surface 9s of the Si oxide film 9. As a result, the Si oxide film 2 and the Si oxide film 9 are integrated into one body, as shown in FIG. 4C. After the bonding, the Si substrate 21 is removed.

When the Si substrate 21 is delaminated by doping hydrogen, hydrogen is first injected into the interface between the epitaxial Si layer 6 and the Si substrate or into the epitaxial Si substrate 6 close to the interface, and thereafter, the Si substrate 21 is delaminated. In this manner, a compression strain applied from the Si substrate 21 to the SiGe layer 4 is released, with the result that the SiGe layer 4 is lattice-relaxed, and simultaneously strain is introduced into the epitaxial Si layer 6 serving as a device layer.

In the manner mentioned in the above, a semiconductor substrate formed of Si substrate 1, the Si oxide film 12, the lattice-relaxed SiGe layer 4 bonded onto the Si oxide film 12, and the strained Si layer 6 stacked in the order mentioned from the bottom is obtained.

In the stained Si layer 6 thus formed, the CZ substrate has less precipitated oxygen and impurities. It is therefore possible to obtain an ideal thin layer having a desired resistance value.

In the second embodiment, since the epitaxial Si layer 6 serving as a device layer can be formed in advance so as to exhibit desired electrical characteristics, no regrowth process is required. Furthermore, the effect upon the SiGe layer 4 due to bonding can be further reduced by forming the oxide film 9 after the SiGe layer 4 is formed and then bonding the oxide film 9 to the oxide film 2.

In the case other than the case where the processing is performed continuously in a clean air atmosphere, for example, in the case where the substrate is processed while being exposed to air, it is possible that an oxide film is formed on the SiGe layer 4 without intention. Therefore, the oxide film 9 in FIG. 4B can be formed without applying any processing.

Figure 10A:
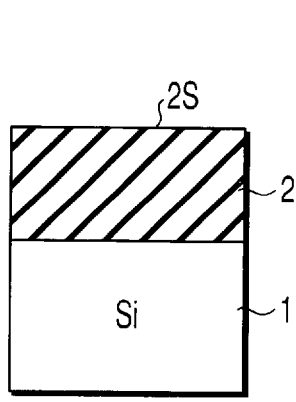
FIGS. 10A–10C are cross-sectional views of a substrate for explaining a method of manufacturing a semiconductor substrate according to a sixth embodiment of the present invention.
Figure 10B:
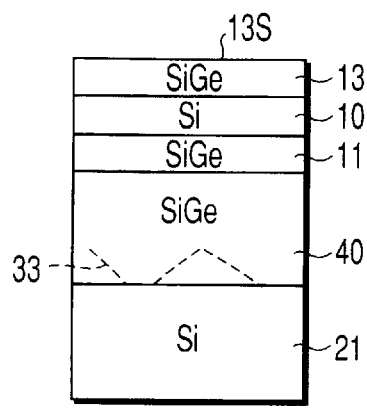
Figure 10C:
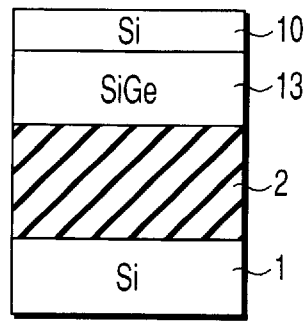

Thereafter, a MISFET shown in FIGS. 10A–10C is formed in the strained Si layer 6 in the same manner as in the first embodiment. In the second embodiment, it is possible to obtain the MISFET excellent in drivability.

Third Embodiment

Figure 5A:
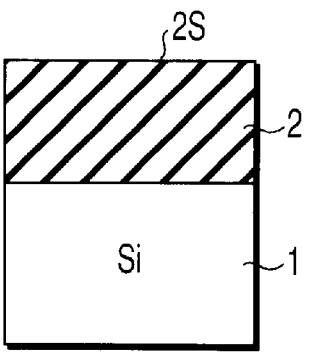
FIGS. 5A–5C are cross-sectional views of a substrate for explaining a method of manufacturing a semiconductor substrate according to a third embodiment of the present invention.
Figure 5B:
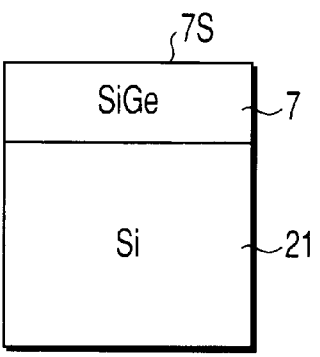
Figure 5C:
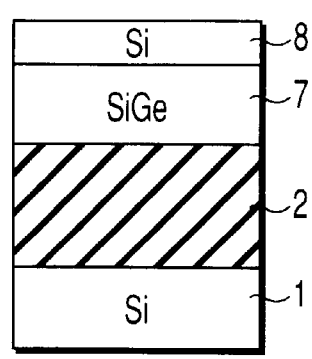

FIGS. 5A–5C are cross-sectional views of a semiconductor substrate showing a method of manufacturing a semiconductor substrate according to a third embodiment of the present invention.

Figure 6:
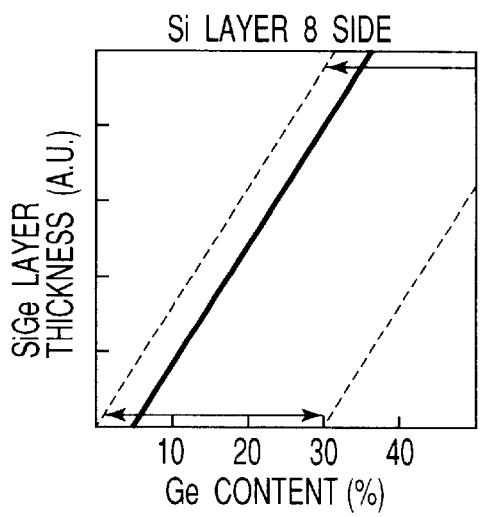
FIG. 6 is a view showing a profile of Ge content in a thickness direction of an SiGe layer according to the third embodiment.

The third embodiment is characterized in that the content of a SiGe layer 7 varies in the thickness direction. More specifically, as shown in FIG. 6, a crystal is grown in such a manner that the Ge concentration of the SiGe thin film 7 is gradually increased from a portion near the Si substrate 1 to a portion near the strained Si layer 8. More specifically, the Ge content of the SiGe layer 7 is controlled such that a Ge concentration near the Si substrate 1 falls within the range of 0 to 30 atomic % and the Ge concentration near the strained Si layer 8 is larger than 30 atomic %.

By controlling the content of SiGe layer 7, the dislocation produced from the interface between the Si oxide film 2 and the SiGe layer 7 grows so as to form a loop in the SiGe layer 7. Therefore, the dislocation does not reach the interface between the SiGe layer 7 and the strained layer 8. As a result, good strained-Si layer 8 can be provided.

Now, the method of manufacturing a semiconductor substrate will be explained. In the first place, as shown in FIG. 5A, an Si oxide film 2 is formed on an Si substrate 1, in the same manner as in the first embodiment. Furthermore, as shown in FIG. 5B, an SiGe layer 7 is formed on the Si substrate 2. In this case, the Ge content is controlled so as to gradually decrease from the side of the Si substrate 21, as described above.

Then, two Si substrates 1 and 21 are bonded in such a manner that the upper surface 2s of the Si oxide film 2 is allowed to face the upper surface 7s of the SiGe thin film 7, in the same manner as in the first embodiment. Subsequently, the Si substrate 21 is removed in the same manner as in the first embodiment. After the SiGe layer 7 is lattice-relaxed, a strained Si layer 8 is regrown on the SiGe layer 7 (FIG. 5C).

In this manner, a semiconductor substrate formed of the Si substrate 1, the Si oxide film 2, the lattice-relaxed SiGe layer 7 having a gradient of a Ge content and formed by bonding on the Si oxide film 2, and the strained Si layer 8 stacked in the order mentioned from the bottom is obtained.

In the third embodiment, the lower the content of Ge of the SiGe layer 7, the closer to the Si oxide film 2. The defects produced in the interface between the Si oxide film 2 and the SiGe layer 7 are confined in the portion of the interface near the Si oxide film 2. After the bonding, a lattice-relaxed SiGe layer is formed in the interface between the SiGe layer 7 and the strained Si layer 8. Thereafter, the Si device layer 8 is formed in the regrowth process. In this manner, a semiconductor layer 8 having a tensile strain is formed on the SiGe layer 7 sufficiently lattice-relaxed.

The degree of the lattice relaxation varies depending upon the thickness of each layer shown in FIGS. 5A–5C, annealing temperature, annealing time, and the thickness of an Si substrate layer 21 to be left in the delamination or polishing process after bonding. Depending upon the processing conditions, it is possible to form an Si device layer with or without compression strain.

Thereafter, a MISFET is formed in the strained Si layer 8 in the same manner as in the first embodiment, as shown in FIGS. 10A–10C. It is possible to obtain the MISFET excellent in drivability also in the third embodiment.

Fourth Embodiment

Figure 8:
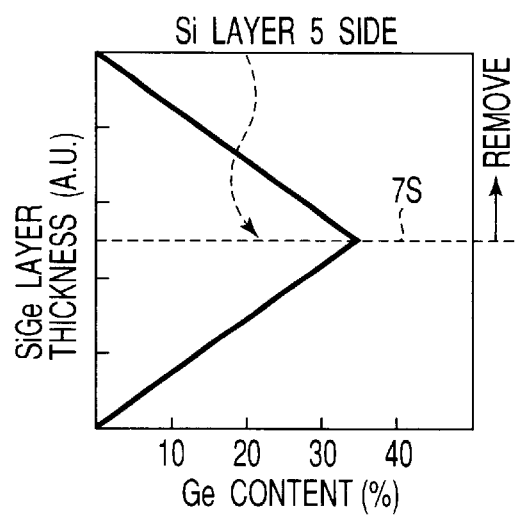
FIG. 8 is a view showing a profile of Ge content in a thickness direction of a SiGe layer according to the fourth embodiment.
Figure 7A:
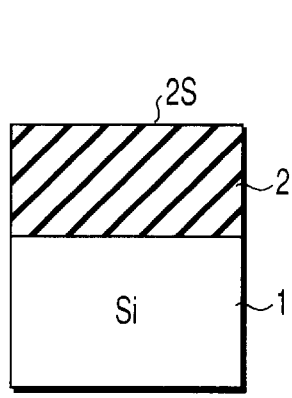
FIGS. 7A–7C are cross-sectional views of a substrate for explaining a method of manufacturing a semiconductor substrate according to a fourth embodiment of the present invention.
Figure 7B:
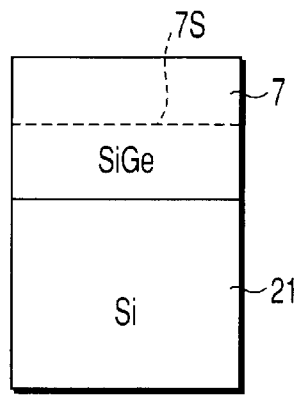
Figure 7C:
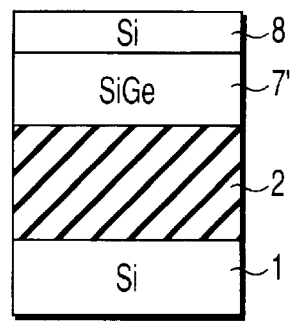

FIGS. 7A–7C are the cross sectional views of a substrate, showing a method of manufacturing a semiconductor substrate according to a fourth embodiment of the present invention. In the fourth embodiment, the SiGe layer 7 has a Ge content gradient. More specifically, the concentration of Ge in the SiGe layer 7 varies along the film-thickness direction, as shown in FIG. 8. The gradient is set such that the portion having the highest Ge concentration is not present in the interface but present in the SiGe layer 7. Thereafter, delamination or thinning of the film is performed such that the portion of the SiGe film 7 having a high Ge concentration comes to the surface. As a result, the surface indicated by a broken line in FIGS. 7B and 8 becomes the upper surface 7s of the thinned SiGe layer 7'. Since the content of the SiGe layer 7 is controlled as mentioned above, the dislocation produced from the interface between Si oxide film 2 and the SiGe layer 7 grows into a loop within the SiGe layer 7' and therefore does not reach the interface between the SiGe layer 7' and the strained Si layer 8. As a result, further satisfactory strained Si layer can be provided.

Furthermore, since the SiGe layer 7 firstly grown on the Si substrate 21 has a low Ge content, the defects due to lattice mismatch are hardly introduced. Therefore, the SiGe layer 7' is obtained with a good crystallinity.

Now, a method of manufacturing a substrate will be explained. In the first place, as shown in FIG. 7A, an Si oxide film 2 is formed on an Si substrate 1 in the same manner as in the first embodiment. As shown in FIGS. 7A–7C and 8, an SiGe thin film 7 is formed on an Si substrate 21 so as to have a Ge content changing 0 atomic % to 35 atomic % to 0 atomic % in the film direction. Subsequently, the SiGe thin film 7 is reduced in thickness until the center portion having the highest Ge content is exposed, to obtain the SiGe layer 7'. As a result, the surface having a Ge content of 35 atomic % is exposed as the upper surface 7s of the SiGe thin film 7'.

Then, two Si substrates 1 and 21 are bonded to each other in such a manner that the upper surface 2s of the Si oxide film 2 is allowed to face the upper surface of 7s of the SiGe thin film 7'. Subsequently, the Si substrate 21 is removed in the same manner as in the first embodiment to form a lattice-relaxed SiGe layer 71. After that, a strained Si layer 8 is regrown on the SiGe layer 7' (FIG. 7C).

In this manner, a semiconductor substrate formed of the Si substrate 1, the Si oxide film 2, the lattice-relaxed SiGe layer 7' formed by bonding onto the Si oxide film 2, and the strained layer 8 stacked in the order mentioned from the bottom is obtained. In this manner, the same effects as in the third embodiment can be obtained.

After that, a MISFET shown in FIGS. 10A–10C is formed in the strained Si layer 8 in the same manner as in the first embodiment. It is possible to obtain the MISFET excellent in drivability also in the fourth embodiment.

Fifth Embodiment

Figure 9A:
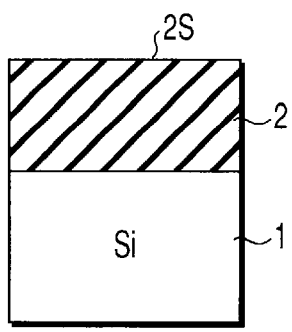
FIGS. 9A–9C are cross-sectional views of a substrate for explaining a method of manufacturing a semiconductor substrate according to a fifth embodiment of the present invention.
Figure 9B:
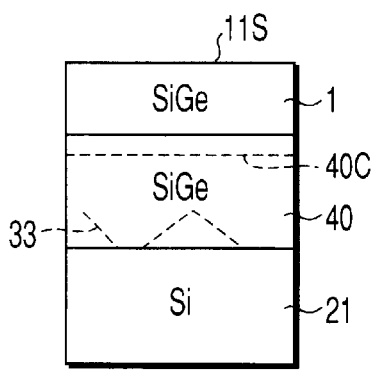
Figure 9C:
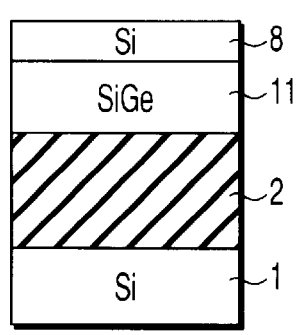

FIGS. 9A–9C are cross-sectional views of a semiconductor substrate, showing a method of manufacturing a semiconductor substrate according to a fifth embodiment of the present invention.

In the fifth embodiment, an SiGe laminated layer consisting of a SiGe layer 40 to which a dislocation is introduced and a lattice-relaxed SiGe layer 11 is formed on an Si substrate 21. The SiGe layer 40 is sufficiently thick and contains Ge whose concentration varies with crystal growth. The SiGe layer 40 therefore functions as a so-called buffer layer. Typically, the SiGe layer 40 has a Ge-content gradient. More specifically, the Ge concentration of the SiGe layer 40 immediately on the Si substrate 21 is 0 atomic %. The Ge concentration increases with the crystal growth to 30 atomic % at a thickness of 2 μm.

Now, a method of manufacturing a semiconductor substrate will be explained. In the first place, as shown in FIG. 9A, an Si oxide film 2 is formed on the Si substrate 1 in the same manner as in the first example. Subsequently, as shown in FIG. 9B, a sufficiently thick SiGe buffer layer 40 having a Ge-content gradient as mentioned above is formed on the Si substrate 21 and lattice-relaxed. At this time, a dislocation 33 is generated in the SiGe buffer layer 40. However, since the buffer layer 40 is sufficiently thick, the dislocation does not have an effect upon the semiconductor layer to be formed on the buffer layer 40.

Subsequently, a lattice-relaxed SiGe layer 11 having a good crystallinity is formed on the lattice-relaxed SiGe buffer layer 40.

Thereafter, two Si substrates 1 and 21 are bonded to each other in such a manner that the upper surface 2s of the Si oxide film 2 is allowed to face the upper surface 11s of the lattice-relaxed SiGe layer 11. Subsequently, the Si substrate 21 and SiGe buffer layer 40 are removed by polishing or hydrogen injection. Subsequently, the strained Si layer 8 is formed on the lattice-relaxed SiGe layer 11 (FIG. 9C).

In this manner, a semiconductor substrate formed of the Si substrate 1, the Si oxide film 2, the lattice-relaxed SiGe layer 11 formed by bonding, and the strained Si layer 8 stacked in the order mentioned from the bottom is obtained.

The SiGe buffer layer 40 confines a threading dislocation and misfit dislocation caused by lattice mismatch in the SiGe buffer layer 4 near the Si substrate 21. As a result, a lattice-relaxed SiGe layer free from the dislocation is formed on the surface of the SiGe buffer layer 40.

The surface of the SiGe buffer layer 40 contains Ge in an amount enough to apply a desired strain to the Si device layer. More specifically, the Ge content is larger than 30 atomic % and lower than 50 atomic %. The distribution of the Ge content is not necessarily uniform in the film thickness direction. Since the SiGe layer 11 containing Ge in the same amount (larger than 30 atomic %) as in the surface of the SiGe buffer layer 40 after the SiGe layer 40 is formed, a high-quality and lattice-relaxed SiGe layer 11 is formed with a lower density of defects such as a dislocation.

However, there is a problem here. To grow the crystal layer of the SiGe layer 40 with a thickness of several μm as a buffer layer, a large amount of raw material and growing time are required. In other words, a great deal of process cost is required. The stacked structure of a strained channel layer and a lattice-relaxed SiGe layer is attained by a delamination process performed after the bonding, as mentioned above. However, to obtain the SiGe layer having a desired thickness before the bonding, it may be possible that hydrogen is injected into a cut surface 40c of e.g., about 0.3 μm in depth (see FIG. 9B), and thereafter, the delamination process is performed. If this method is employed, the lattice-relaxed SiGe buffer layer 40 remaining after the delamination step can be used again. Therefore, the process can be simplified and the semiconductor material can be saved. It follows that the manufacturing cost of the substrate can be reduced.

Thereafter, the MISFET shown in FIGS. 10A–10C is formed in the strained Si layer 8, in the same manner as in the first embodiment. It is possible to obtain the MISFET excellent in drivability also in the fifth embodiment.

Sixth Embodiment

FIGS. 10A–10C are cross-sectional views of a semiconductor substrate, showing a method of manufacturing a semiconductor substrate according to a sixth embodiment of the present invention.

In the sixth embodiment, a lattice-relaxed SiGe layer 11, a strained Si layer 10, another lattice-relaxed SiGe layer 13 are successively formed on a lattice-relaxed SiGe buffer layer 40, and thereafter, the bonding process is performed.

Now, a method of manufacturing a semiconductor substrate will be explained. In the first place, an Si oxide film 2 is formed on an Si substrate 1 in the same manner as in the first embodiment, as shown in FIG. 10A. Subsequently, as shown in FIG. 10B, the SiGe buffer layer 40 is formed thick on another Si substrate 21 in the same manner as in the fifth embodiment, thereby lattice relaxing the SiGe buffer layer 40. Thereafter, on the lattice-relaxed SiGe buffer layer 40, a lattice-relaxed SiGe layer 11, a strained Si layer 10, and a lattice-relaxed SiGe layer 13 are successively grown.

Then, two Si substrates 1 and 21 are bonded to each other in such a manner that the upper surface of 2s of the Si oxide film 2 is allowed to face the upper surface 13s of the lattice-relaxed SiGe film 13. Subsequently, the Si substrate 21, the lattice-relaxed SiGe buffer layer 40 and the lattice-relaxed-SiGe 11 are removed by polishing or hydrogen delamination so as to expose the strained Si layer 10 (FIG. 10C).

In this manner, a semiconductor substrate formed of the Si substrate 1, the Si oxide film 2, the lattice-relaxed SiGe layer 13 formed by bonding, and the strained Si layer 10 in the order mentioned from the bottom is obtained.

In the sixth embodiment, a tensile strain is naturally applied to the Si layer 10 on the lattice-relaxed SiGe layer 11 formed on the Si substrate 21, and the SiGe layer 13 formed on the Si layer 10 is lattice-relaxed.

The lattice-relaxed SiGe layer 13 may be formed so as to have a gradient of a Ge concentration in order to prevent defects from producing from the interface between the Si oxide film 2 and the SiGe layer 13 after the bonding, as shown in the third or fourth embodiments. Alternatively, the bonding may be performed after an insulating layer 9 is formed on the lattice-relaxed SiGe layer 13, as is in the second embodiment.

In the sixth embodiment, it is possible to form the Si layer 10 having a tensile strain applied thereto directly on the SiGe layer 13 sufficiently lattice-relaxed. Furthermore, the Ge concentration of the lattice-relaxed SiGe layer 13 may be set within the range of 30 to 100 atomic %. Moreover, it is possible to set the thicknesses of the SiGe layer 13 and the strained Si device layer 10 on the Si oxide film 2 at 10 nm or less.

As a result, it is easy to set the total thickness of the layers formed on the insulating film 2 within the range of 40 nm or less. It is therefore possible to have sufficient SOI effects and apply a sufficient strain to the Si device layer 10.

Thereafter, in the same manner as in the first embodiment, the MISFET shown in FIGS. 10A–10C is formed in the strained Si layer 10. It is possible to obtain the MISFET excellent in drivability also in the sixth embodiment.

Seventh Embodiment

Figure 11A:
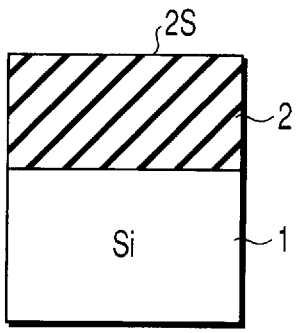
FIGS. 11A–11C are cross-sectional views of a substrate for explaining a method of manufacturing a semiconductor substrate according to a seventh embodiment of the present invention.
Figure 11B:
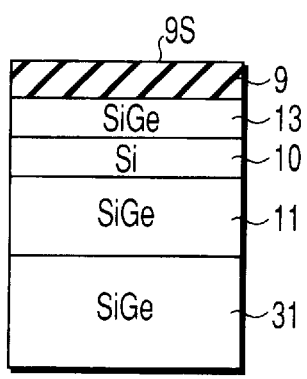
Figure 11C:
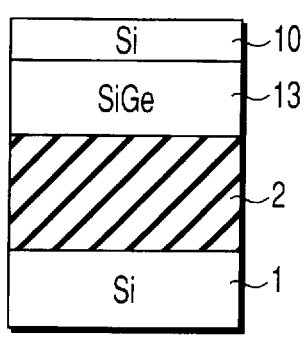

FIGS. 11A–11C are cross-sectional views of a semiconductor substrate showing a method of manufacturing a semiconductor substrate according to a seventh embodiment of the present invention. In the seventh embodiment, as one of the two substrates to be bonded, an SiGe substrate 31 is used in place of the Si substrate 21. On a lattice-relaxed SiGe layer 31, a lattice-relaxed SiGe layer 11 is regrown. A strained Si layer 10, a lattice-relaxed layer 13, and an insulating layer 9 are further formed on the lattice-relaxed SiGe layer 11.

Thereafter, a method of manufacturing a semiconductor substrate will be explained. In the first place, an Si oxide film 2 is formed on the Si substrate 1, as shown in FIG. 11A. Furthermore, as shown in FIG. 11B, the SiGe layer 11 is formed on the SiGe substrate 31 in the same manner as in the first embodiment, and then, an Si layer 10, an SiGe layer 13 (the Ge content of the SiGe layer 13 near the Si layer 10 is larger than 30 atomic %), and the Si oxide film 9 are successively grown on the SiGe layer 11.

Then, the Si substrate 1 and SiGe substrate 31 are bonded in such a manner that the upper surface 2s of the Si oxide film 2 is allowed to face the upper surface 9s of the Si oxide film 9, in the same manner as the first embodiment. Subsequently, the SiGe substrate 31 and the SiGe layer 11 are removed by polishing or hydrogen delamination so as to expose the Si layer 10.

In this manner, as shown in FIG. 11C, a semiconductor substrate formed of the Si substrate 1, the Si oxide film 12, a lattice-relaxed SiGe layer 13 formed by bonding and the strained Si layer 10 stacked in the order mentioned from the bottom is obtained.

In this case, it is better if at least one of the Si oxide film 2 and the Si oxide film 9 is present for the bonding. Defects may be produced at a bonding surface between the SiGe layer 13 and the insulating layer 9 during the bonding step and the thinning step or delamination step. To confine the defects within the SiGe layer 13, it is better to make the Ge content in the SiGe layer 13 nonuniform, or to make the lattice constant of the SiGe layer 13 nonuniform.

In the seventh embodiment, the substrate 31 has the same SiGe composition as that of the layer 11 serving as a stressor. However, the Ge content of the layer 11 may be set at a desired concentration by controlling the composition of the layer formed on the substrate 31.

Thereafter, the MISFET shown in FIGS. 10A–10C is formed on the strained Si layer 10 in the same manner as in the first embodiment. It is possible to obtain the MISFET excellent in drivability also in the sixth embodiment.

In the first to seventh embodiments, an SiGe layer is used as the layer to which strain is to be applied and an Si layer is used as the device layer. However, these two layers may be formed of any two layers as long as they have different lattice constants. In other words, two layers may be a combination of two substances selected from substances of Si, SiGe, GaAs, SiC, GaN, GaAlAs, InGaP, InGaPAs, $Al_2O_3$, BN, BNC, and C; and Si heavily doped with impurity such as B, P and As, $SiN_x$, and ZnSe. The effects of the present invention can be obtained if the two layers satisfy the aforementioned conditions.

As described in the foregoing, according to the present invention, it is possible to reduce degradation of crystallinity of the device layer due to defects propagated from the strained layer serving as the stressor; at the same time, it is possible to reduce the total thickness of the layers formed on the insulating film of the SOI structure. By virtue of this, the factors reducing the device characteristics can be eliminated. As a result, it is possible to lower power consumption and attain the high integration of the device and high performance of the semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a substrate;

an insulating film formed on the substrate;

a first semiconductor layer lattice-relaxed and formed on the insulating film substantially in contact therewith, a lattice constant of the first semiconductor layer being graded in a thickness direction thereof such that the lattice constant of the first layer increases as a distance from the insulating film increases;

a second semiconductor layer having a tensile lattice strain and formed on the first semiconductor layer;

a gate insulating layer selectively formed on the second semiconductor layer;

a gate electrode formed on the gate insulating film;

a channel region formed in a surface of the second semiconductor layer immediately under the gate electrode; and a pair of source/drain regions selectively formed in the second semiconductor layer so as to be spaced apart from each other by the channel region.

2. The semiconductor device according to claim 1, wherein the first semiconductor layer is made of SiGe and the second semiconductor layer is made of Si.

3. The semiconductor device according to claim 1, wherein the first semiconductor layer is formed of at least one selected from the group consisting of SiGe and SiC.

* * * * *